United States Patent [19]

Esser et al.

[11] Patent Number: 4,590,509

[45] Date of Patent: May 20, 1986

[54] MIS HIGH-VOLTAGE ELEMENT WITH HIGH-RESISTIVITY GATE AND FIELD-PLATE

[75] Inventors: Leonard J. M. Esser; Henricus M. J. Vaes; Adrianus W. Ludikhuize, all of Eindhoven, Netherlands

[73] Assignee: U.S. Philips Corporation, New York, N.Y.

[21] Appl. No.: 539,448

[22] Filed: Oct. 6, 1983

[30] Foreign Application Priority Data

Oct. 6, 1982 [NL] Netherlands ............... 8203870

[51] Int. Cl.⁴ .............. H01L 29/78; H01L 29/04; H01L 27/04; H01L 29/40
[52] U.S. Cl. ........................... 357/53; 357/41; 357/59; 357/23.1; 357/24; 357/23.8
[58] Field of Search .......... 357/24 R, 24 M, 23.4, 357/23.8, 23.1, 23.7, 53, 59, 41, 23.14

[56] References Cited

U.S. PATENT DOCUMENTS

| | | | |
|---|---|---|---|
| 3,932,882 | 1/1976 | Berger | 357/24 |
| 3,943,545 | 3/1976 | Kim | 357/24 |
| 4,157,557 | 6/1979 | Sato et al. | 357/23.14 |
| 4,172,260 | 10/1979 | Okabe et al. | 357/51 |
| 4,270,137 | 5/1981 | Coe | 357/23.4 |

OTHER PUBLICATIONS

Whelan et al., "Resistive-Insulated Gate Arrays ..." *Phillips Res. Reports*, vol. 30, No. 6, Dec. 1975, pp. 436-482.
Hu et al., "A Resistive-Gated IGFET Tetrode," *IEEE Trans. on Electron Devices*, vol. ED-18, No. 7, Jul. 1971, pp. 418-425.

*Primary Examiner*—Martin H. Edlow
*Assistant Examiner*—E. Fallick
*Attorney, Agent, or Firm*—Robert T. Mayer; Steven R. Biren

[57] ABSTRACT

By the use of high-ohmic polycrystalline silicon(poly) in MIS elements, a depletion layer can be formed in the poly material which brings about an electric decoupling between the poly (gate) and the underlying semiconductor body. This effect can be utilized advantageously in various circuit elements, such as in CCD's, in order to obtain a favorable potential distribution in the substrate; in MOS transistors in order to reduce the parasitic capacities; and in high-voltage devices in order to increase the breakdown voltage at the edge of the field plate (resurf).

9 Claims, 20 Drawing Figures

MIS HIGH-VOLTAGE ELEMENT WITH HIGH-RESISTIVITY GATE AND FIELD-PLATE

BACKGROUND OF THE INVENTION

The invention relates to a semiconductor device having a semiconductor element of the MIS type comprising a monocrystalline semiconductor body, one surface of which is provided with a comparatively thin dielectric layer which constitutes the gate dielectric of the MIS element and on which a gate electrode of doped semiconductor material is provided for influencing the surface potential in the semiconductor body.

Semiconductor elements of the MIS type are to be understood to mean not only insulated gate field effect transistors, charge transfer devices (CCD's and BBD's), and other devices in which a charge transport can be controlled in the semiconductor body by means of the gate electrode, but also devices in which the gate electrode constitutes a field plate, more particularly for influencing breakdown voltages.

In semiconductor technology, polycrystalline silicon is used very frequently as a gate electrode. The popularity of polycrystalline silicon, designated as polysilicon or poly, is due to a large extent to the fact that polysilicon is a particularly suitable material in self-registering MOS processes, in which the gate electrode and the source/drain zones are defined by the same masking step. In integrated circuits, polysilicon is used not only as a gate electrode, but also for the wiring.

In order inter alia to keep dissipation and/or RC-times at a minimum, it is common practice to make the resistance of the polysilicon generally as small as possible, for example, by doping the poly to the highest possible extent ($10^{20}$–$10^{22}$ atoms/cm$^3$) or by converting the poly with the aid of a suitable metal into a silicide.

The gate dielectric is constituted in most cases by silicon oxide, which when the semiconductor body itself consists of silicon, can be obtained by oxidation of the surface of the semiconductor body. When the gate electrode constitutes a gate electrode of a field effect device (transistor or, for example, CCD), an oxide layer having a thickness of the order of 0.1 $\mu$m is generally used. In those cases in which the device has to be operated at higher voltages or in which the gate electrode constitutes a field plate for increasing breakdown voltages, the thickness of the gate dielectric may be larger.

In the choice of the thickness of the gate dielectric, several factors may play a part, which may lead to different requirements with respect to the thickness. The ultimate choice will often be a compromise, in which the various requirements are satisfied to a larger or lesser extent (or are not satisfied at all) depending upon their importance. Consequently, the operation of the device is often basically satisfactory, but further improvements would be desirable. This will be explained more fully with reference to several examples.

As is known, A CCD is a device in which a series of discrete charge packets are transported under the influence of clock signals through a channel located at or near the surface of the semiconductor body. The clock signals are supplied to a number of clock electrodes which are arranged as a row on an oxide layer covering the surface and each constitutes an MIS capacitor with the semiconductor body. At a given amplitude of the clock signals, the maximum size of the charge packets is determined by the value of the MIS capacitances. In general, the requirements imposed on the maximum charge packets in connection, for example, with the dynamic power or the signal-to-noise ratio make a maximum capacitance per unit surface area desirable. According to the prior art, this preference is more important, as with the aid of photolithographic techniques the lateral dimensions of the device or at least the various components thereof can be made smaller.

In order to obtain a high charge storage capacity per unit surface area, it is desirable to make the oxide thickness as small as possible or at least as small as is justified in connection with a still reasonable manufacturing output yield.

In order to transfer charge rapidly from one place to another, decoupling between the charge and the electrode of the first charge storage site is desirable. Due to such a decoupling, the formation of drift fields (fringing fields) in the channel is possible, as a result of which the transfer process is improved (more rapidly and/or with lower loss). In this connection, it would be advantageous to make the oxide thickness as large as possible. In the manufacture of a CCD, no attention is paid to this aspect, but the oxide thickness is chosen to be as small as possible in order to obtain a maximum capacity.

It may also be desirable that thin and thick oxide are both simultaneously available. As is known, for example, in a D-MOST or a DSA-MOST, the source and drain zones are separated from each other by a channel region and an adjoining drift region. In a frequently used method of manufacturing D-MOST's, first the thin-gate dielectric is applied; then the gate electrode is formed and subsequently the zone forming the channel region and the source and drain zones are provided while the gate electrode forms part of the doping mask. In a transistor thus manufactured, the drift region is separated from the gate electrode by the thin gate oxide. However, in connection with the high-frequency properties of the transistor, a decoupling between the gate region and the drift region is desirable. Such a decoupling could be obtained by means of thick oxide above the drift region. However, the process of accurately applying the thin oxide above the channel region and the thick oxide above the drift region requires very critical alignment steps, which become more difficult as the dimensions become smaller. For this reason, generally, the thin gate oxide is also applied above the drift region.

The overlapping capacitance of the gate electrode with other parts of the transistors can play a part in various types of transistors, which are intended for various application. For example, for tuning circuits, an MOS transistor may be required, which, in order that it can be utilized as a switch in this type of circuit, has a low "on"-resistance and, in the "off" state, a low capacitance. When for the sake of simplicity it is assumed that a conventional D-MOST is used of the kind described above, a low on resistance can be obtained by carrying out an additional implantation in the drift region of the transistor, as a result of which at the relevant area the doping is increased. Due to this implantation, the oxide thickness remaining unchanged, the drain/gate capacitance and hence also the drain/source capacitance would increase. In order to render such a transistor suitable for use in tuning circuits, a decoupling between channel/drain and the gate electrode would therefore be desirable.

It may be advantageous not only in connection with undesirable parasitic capacitances, but also in other respects to electrically decouple the gate electrode and the semiconductor body.

As is known, in high-voltage transistors, the breakdown voltage may be increased by means of so-called field plates, as a result of which the electrical field strength at the surface is decreased. In the non-prepublished Dutch Patent Application No. 8200464, corresponding to U.S. Ser. No. 352,450, now abandoned, the contents of which are incorporated by reference in the present application, the use of field plates in combination with the resurf principle is described. The resurf principle is known per se, for example, from the article by J. A. Appels et al entitled "Thin Layer High-Voltage Devices (Resurf Devices)" In Philips Journal of Research, Vol. 35, No. 1, 1980, pg 1–3. Such devices comprise a substrate region of the one, for example, the p-, conductivity type and an adjoining n-type surface layer, for example, an epi layer, in which a circuit element is formed and which forms a pn junction with the substrate: In these known devices, the breakdown voltage may be very high and may closely approach and even equal the so-called unidimensional calculated value (at which the pn junction is assumed to be planar and to extend infinitely) due to the fact that a high reverse voltage across the substrate/epi pn junction the field strength at the surface is considerably decreased by the complete depletion of the semiconductor layer.

A disadvantage of known resurf devices is that the overall doping of the surface layer is approximately $10^{12}$ atoms/cm$^2$. This results in that in the known resurf devices, the current-conveying power of the semi-conductor layer is lower than is sometimes desirable. In order to be able to choose a higher Nd product while maintaining the breakdown properties, in the above-mentioned Dutch Application No. 8200464 it has been proposed to provide on the surface a field electrode or field plate, as a result of which depletion of the surface layer can take place not only from the substrate, as in the known device, but also from the surface. In FIGS. 1 and 2 of the prior Application, D-MOST's are shown of the resurf type, in which the said field plate is connected to the insulated gate and to the source electrode, respectively.

If these field plates were to extend throughout the drift region as far as above the contact zone of the drain, it is possible for the maximum permissible voltage to be reduced again to far below the said calculated value of the breakdown voltage of the pn junction between the substrate and the surface layer. This may be due to the large voltage difference over the comparatively thin oxide between the drain and the field plate located immediately above the latter, as a result of which breakdown can occur over the oxide and/or breakdown is produced in the silicon. A possible method of preventing such a breakdown could be for the field plate not to be provided as far as above the drain zone, and so only above a part of the drift region. Such a method has the disadvantage, however, that the surface potential cannot be controlled by the field plate in the whole drift region. Another method of preventing breakdown, which consists in forming thick oxide at least locally above the drift region, may give rise to step coverage problems and is therefore less suitable. The problems just mentioned with respect to field plates apply not only to resurf elements, but in general to devices, in which a field plate is located above a surface region in the semiconductor body, which exhibits a large voltage difference with respect to the field plate.

SUMMARY OF THE INVENTION

The invention has inter alia for its object to provide a gate electrode configuration with which the aforementioned and related problems can be eliminated for the major part or at least to a large extent. The invention is based on the recognition of the fact that a depletion zone in a semiconductor layer has properties comparable with those of a dielectric and that, when a depleted semiconductor layer is formed between a gate electrode and the dielectric, a controllable quasi-thickened part of the dielectric can be obtained.

According to the invention, a semiconductor device of the kind described above is characterized in that at least a part (referred hereinafter as high-ohmic or high-resistivity part) of the gate electrode adjoining the gate dielectric has such a low doping concentration and such a conductivity type that under usual operating conditions, while avoiding breakdown, a depletion layer can be formed, which extends from the gate dielectric into the high-ohmic part of the gate electrode, as a result of which at least in part a decoupling between the semiconductor body and the gate electrode can be obtained temporarily and/or locally.

Due to the fact that the depletion layer behaves like a dielectric—though with a charge distribution of fixed ions—, an increase of the thickness of the dielectric can be obtained at the area at which this depletion layer is formed, which results in a decoupling between the gate electrode and the semiconductor body. Due to the fact that the depletion layer is formed only with a given direction and from a given value of the electric field, the decoupling can be advantageously obtained under given operating conditions, whereas under other operating conditions the depletion layer is not formed, so that then a strong coupling between the gate electrode and the semiconductor body can be obtained. The area at which—and the condition in which—the depletion layer is formed in the gate electrode, can be chosen, as will appear from the embodiments, in dependence upon the doping of the gate electrode.

BRIEF DESCRIPTION OF THE DRAWING

The invention will be described more fully with reference to several embodiments and the accompanying diagrammatic drawing, in which.

It should be noted that the Figures are schematic and are not drawn to scale.

DESCRIPTION OF THE PREFERRED EMBODIMENTS

Figure 1:
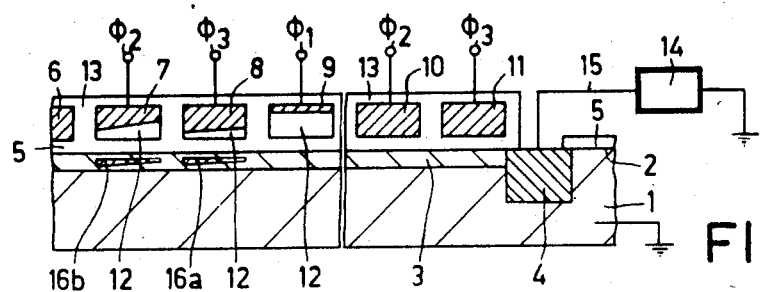
FIG. 1 is a sectional view of a part of a charge-coupled device according to the invention.

The first embodiment of a semiconductor device comprising an element of the MIS-type according to the invention relates to a charge-coupled device, of which FIG. 1 shows only a part comprising a complete cell with three electrodes and the output portion. The device belongs to a class of charge-coupled devices of the BCCD or PCCD type, in which the charge transport takes place at least in part in the interior or the bulk of the semi-conductor body. The device for this purpose comprises a monocrystalline semiconductor body 1 of the one conductivity type, which is provided at the surface 2 with a surface layer 3 of the opposite conductivity type. In order to facilitate the further description, it will be assumed that the substrate 1 consists of p-type silicon and that the surface layer 3 consists of n-type silicon, but it should be appreciated that the conductivity types may also be reversed and that instead of silicon other suitable semiconductor materials may also be used. The doping concentration of the substrate lies, for example, between $10^{15}$ and $10^{17}$ atoms/cm$^3$. The doping concentration of the n-type surface layer 3 lies, for example, between $10^{16}$ and $10^{17}$ atoms/cm$^3$, while the thickness of the layer 3 lies between 0.2 and 0.5 $\mu$m. The thickness and the doping concentration of the zone or layer 3 should be chosen, as is generally known, so that in the operating condition, a depletion zone can be formed throughout the thickness of the layer 3 without the occurrence of breakdown. The layer 3 is further provided with a strongly doped n-type output zone 4 to which a suitable voltage can be applied. The surface 2 is coated with a dielectric layer 5, which generally consists of silicon oxide, but which of course may also comprise layers of another suitable material or layers of different materials. The thickness of the oxide layer 5 lies, for example, between 0.05 and 0.1 $\mu$m.

On the oxide layer 5 are formed clock electrodes 6-11, by means of which charge packets formed in the semiconductor layer 3 can be transported to the output zone 4 by the application of clock voltages. In the Figure, only five electrodes are shown, but it should be appreciated that actually and depending upon the use this number may be considerably larger.

The electrodes 6-11 are manufactured from a doped semiconductor material, in particular silicon. In contrast with the usual situation, the clock electrodes 6-11 are only weakly doped, the doping concentration and the dopant used being chosen so that under usual operating conditions, while avoiding breakdown, a depletion layer 12 can be formed, which extends from the oxide layer 5 through at least a part of the thickness of the high-ohmic clock electrodes in the latter. The depletion layers 12 and the effects obtained will be referred to hereinafter.

Since the semiconductor layer 3 is of the n-conductivity type, in the present embodiment the electrodes 6-11 are p-type doped. The doping concentration is of the same order of magnitude as that in the semiconductor layer 3 and lies, for example, between $10^{15}$ and $5.10^{17}$ boron atoms/cm$^3$.

The electrodes 6-11 can be manufactured by means of known techniques by depositing and etching polycrystalline silicon (poly). For the sake of simplicity, the electrodes 6-11 in the drawing constitute a monolayer of poly, but it should be appreciated that also a two-or three-layer overlapping electrode configuration may be used for the electrodes.

The electrodes 6-11 are coated on the upper side with an insulating layer 13, for example, a layer of silicon oxide, which also constitutes a separation between the electrodes.

When determining the suitable doping concentration, it may often be desirable to take into account the traps in the polysilicon. The density of these traps is generally a maximum at the grain boundaries. The mean density therefore depends upon the size of the mono-crystalline grains in the poly material and hence also upon the specific technology. When the total number of traps is of the same order of magnitude as the total number of active impurity atoms, at least a considerable part of the free charge carriers supplied by the impurity atoms can be trapped again by the traps, as a result of which the grains could be depleted already by nature. Disadvantageous effects of the large number of traps in poly can be avoided, for example, by choosing the doping concentration slightly higher than would be the case in the absence of traps or at least with a very low trap density comparable with that in monocrystalline silicon. In another, simpler method, the number of traps is reduced to a negligible low level, for example, by means of a laser heating (laser annex) treatment known per se, by means of which the deposited polymaterial approaches the monocrystalline structure more closely.

Figure 2:
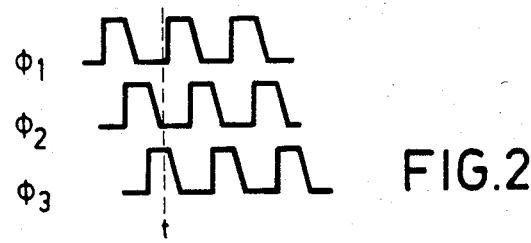
FIG. 2 shows a block diagram of the clock voltages applied to the device of FIG. 1.

During operation, a positive voltage is applied to the n-type layer 3, for example, with the aid of the means 14 and via the supply conductors 15 and the n$^+$ output zone 4 so that the layer 3 is depleted throughout its thickness at reference potential of the electrodes 6-11 and of the substrate 1. The clock voltages $\phi_1$, $\phi_2$ and $\phi_3$ shown in FIG. 2 as a function of time are applied to the electrodes 6-11. In order to explain the operation of the device, it is assumed that the voltage $\phi_2$ is applied to the electrode 7, the voltage $\phi_3$ is applied to the electrode 8 and the voltage $\phi_1$ is applied to the electrode 9 (through clock lines not shown in the Figure).

The positive potential of the n-type layer 3 with respect to the electrodes 6-11 has, in addition to the known field effect action in the layer 3, a field effect action in the electrodes themselves. In principle this reverse field effect will always occur when poly electrodes are used, but will be not be or substantially not noticeable in known devices due to the doping in the poly electrodes. However, in the device according to the invention described herein, in which the electrodes are comparatively weakly p-type doped with a doping concentration of the order of that in the layer 3, the positive potential of the n-type layer 3 produces a depletion region 12 in the poly electrodes, which has a real influence on the electrical behavior of the device.

It should be noted that the depletion region is indicated only in the electrodes 7, 8 and 9, but it should be appreciated that such a depletion zone will be formed also in the remaining electrodes. For explanation of the operation, FIG. 1 shows the situation at the instant t (FIG. 2), at which the negative stroke of the clock voltages $\emptyset_2$ and $\emptyset_1$ is applied to the electrodes 7 and 9 and the positive stroke (for example, 10 V) of the clock voltage $\emptyset_3$ is applied to the electrode 8. In the drawing, a charge packet is represented, which is transferred from the electrode 7 to the electrode 8, while the part 16a of this charge packet has been transferred already and the part 16b is still stored under the electrode 7 and still has to be transferred. Due to the positive stroke of the clock voltage $\emptyset_3$, the depletion region 12 in the electrode 8 is small, at least smaller than the depletion regions 12 in, for example, the electrode 9. Preferably, the thickness of the depletion region 12 in the electrode 8 is as small as possible because the thickness of this depletion region determines together with the insulating layer 5 the charge storage capacity of the device, which should be as high as possible. In this case, therefore, a strong capacitive coupling between the charge packet 16a and the electrode is desirable. The depletion region 12 in the electrode 7 is or becomes larger due to the negative stroke of the clock voltage $\emptyset_2$. As a result, the effective distance between the electrode and the charge packet 16b present under the electrode becomes larger and the electrode and the charge 16b are electrically decoupled at least in part. It can be shown by calculations that electrical fields (fringing fields) can be formed in the semiconductor layer 3 due to the voltage difference between the electrodes 6 and 8, which fields become larger as the effective distance between the electrode 7 and the charge 16b stored under it becomes larger. Therefore, the formation of the comparatively thick depletion region 12 in the electrode 7 results in that, in the subjacent part of the semiconductor layer 3, fields are formed which determine the charge transport or at least the speed of the charge packet. This speed of transport and hence the speed at which the device can be operated can be considerably higher than the maximum speed of transport with the use of conventional highly doped poly electrodes, in which during operation, depletion does not or substantially not occur due to the high doping.

The depletion region 12 will become larger as the quantity of charge of the packet 16b that has been transferred becomes larger. During transport, the size of the charge packet 16b will vary in the charge transport direction in a sense such that, viewed in the direction of transport, the size of the packet decreases, as is illustrated in FIG. 1. Accordingly, the thickness of the depletion region 12 will also vary in the electrode 7, the depletion region 12 increasing from the lefthand to the righthand side. As the charge packet 16b is transferred further, the thickness of the depletion region 12 in the electrode 7 will become larger. When the charge packet 16b has been transferred completely to the next stage of the register under the electrode 8, the thickness of the depletion region will be equal or substantially equal to the thickness of the depletion region 12 in the electrode 9, which acts during the transfer process as a blocking electrode. The charge packet 16b is then decoupled to a maximum with respect to the electrode 7, as a result of which the transfer of the last remnants of the charge packet 16b to the packet 16a can take place under the influence of the then-prevailing electric fields at a high speed.

At the same time, due to the smaller voltage difference between the electrode 8 and the n-type channel 3, a depletion region 12 is present in the electrode 8, whose thickness is smaller than that of the depletion regions in the electrodes 7 and 9. The effective distance between the charge 16a and the electrode 8 is therefore smaller so that the capacitive coupling between the electrode 8 and the charge 16a is also smaller, which determines the charge storage capacity of the device. Dependent upon the size of the charge packet, the depletion layer in the electrode 8 may even disappear completely. Accumulation of holes in the electrode 8 may then occur simultaneously with accumulation of electrons in the channel.

The device described herein therefore combines by means of the low doping concentration in the poly electrodes a weak electrical coupling between semiconductor body and charge-emitting electrode, which results in a high speed of transport, with a strong electrical coupling between the semiconductor body and the charge-receiving electrode, which results in a large input/output current. This combination of properties may also be obtained while using conventional highly-doped electrodes by the use of a channel 3 having a large thickness of, for example, 3 $\mu$m, in which the charge can be transported at a large distance from the surface 2 and can be stored at a comparatively small distance from the surface. Advantageously, use may then be made of a given doping profile in the channel, as described, for example, in U.S. Pat. No. 4,012,759. By the use of the p-type weakly doped poly electrodes, i.e. lower than approximately $10^{18}$ atoms/cm$^3$, it is possible, while maintaining favorable properties, to use a thin layer 3, i.e. thinner than 1 $\mu$m, which has inter alia the advantages of lower leakage currents and a higher transport efficiency.

Figure 20:
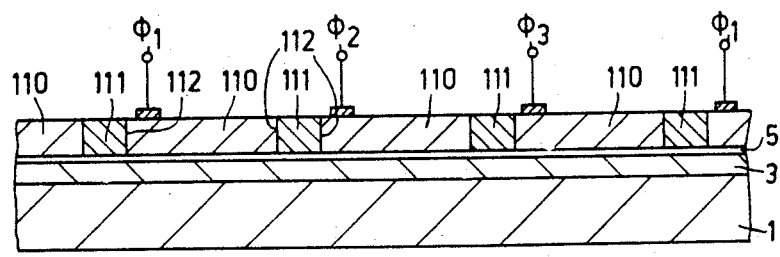
FIG. 20 shows a still further embodiment of a charge-coupled device.

FIG. 20 shows in sectional view a part of a charge-coupled device according to the invention, which can be considered as a modification of the device shown in FIG. 1 and in which corresponding parts are provided with the same reference numerals as in the device of FIG. 1. The present device differs from the latter device in that the poly electrodes are in the form of a continuous layer of polycrystalline silicon. In this layer, the parts 110 are defined, which constitute the clock electrodes proper and consist of high-ohmic p-type silicon having a doping concentration corresponding to that of the electrodes 6–11 in the first embodiment. The parts 110 are provided with diagrammatically indicated connections for applying the clock voltages $\emptyset_1$, $\emptyset_2$ and $\emptyset_3$. The parts 110 are separated from each other by intermediate parts 111 which are n-type conducting and constitute the pn junctions with the parts (electrodes) 110.

In this configuration, two adjacent parts 110 are separated from each other by two pn junctions 112. When clock voltages are applied, the parts 111 invariably follow the most positive voltage level. One of the two said pn junctions is invariably cut off and therefore constitutes an electrical insulation between adjacent parsts 110. The low doping concentration produces in the same manner as in the embodiment shown in FIG. 1 depletion layers in the high-ohmic parts 110, as a result of which the effects already described with reference to FIG. 1 can be obtained.

Figure 3:
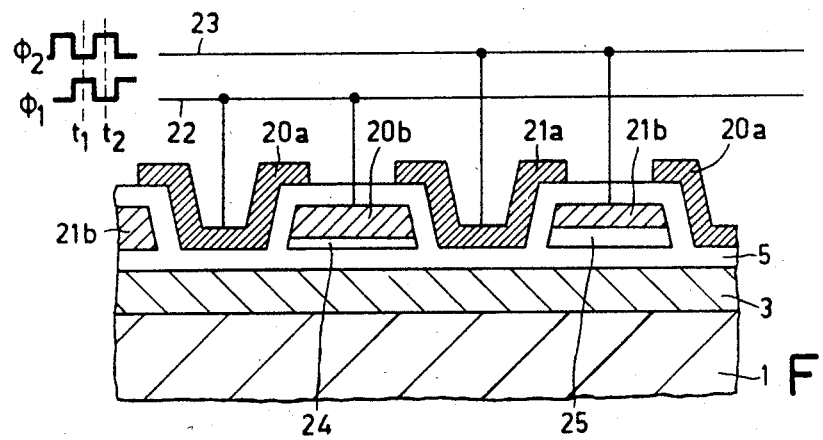
FIG. 3 shows a 2-phase charge-coupled device according to the invention.

Besides an increase in speed, the decoupling obtained by the depletion layer in the high-ohmic poly electrodes can also be utilized for obtaining other effects. With reference to the following embodiment, it will be shown how the said decoupling can be utilized for forming an asymmetrical potential profile in the channel in a 2-phase CCD. For this purpose, FIG. 3 shows a sectional view of a charge-coupled device of the same type as in the preceding embodiment having a p-type substrate 1 provided with a thin n-type surface layer 3. On the insulating layer 5 of silicon oxide covering the surface 2 are arranged the clock electrodes 20 and 21, which are alternately connected to the clock lines 22 and 23. Through these clock lines, the clock voltages $\emptyset_1$ and $\emptyset_2$, which are shown diagrammatically in the Figure, can be applied.

The electrodes 20 each comprises a low-ohmic transfer part 20a and a part 20b of high-ohmic p-type polycrystalline silicon. In the same manner, the electrodes 21 are composed of a low-ohmic transfer part 21a and a high-ohmic part 21b of weakly doped p-type silicon, which constitutes the storage part. The composition of the high-ohmic parts 20b,21b may be the same as that of the electrodes 6–11 in the preceding embodiment. The connections between the electrodes and the clock lines 22,23 may be formed outside the plane of the drawing in one of the usual ways. The low-ohmic electrodes 20a,21a may be made of a suitable metal, for example, Al, or of low-ohmic highly doped silicon.

Figure 4:
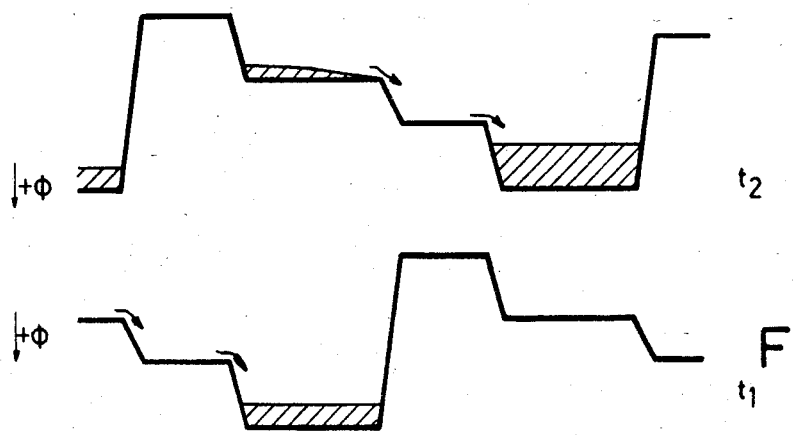
FIG. 4 shows diagrammatically potential distributions occurring at 2 different instants in the device shown in FIG. 3.

During operation, the same voltage levels may be applied to the various regions as in the first embodiment; further, for the high and the low level of the clock voltages $\emptyset_1$ and $\emptyset_2$ the same values may be chosen as for those of the clock voltages $\emptyset_1$, $\emptyset_2$ and $\emptyset_3$ in the embodiment described above. FIG. 4 shows the potential distribution in the surface layer 3 for 2 instants t1 and t2. At t1, the high level of $\emptyset_1$ is applied to the electrodes 20 and the low level of $\emptyset_2$ is applied to the electrodes 21. Due to the fact that both in the poly electrodes 20b and in the poly electrodes 21b depletion regions 24,25 are formed (indicated by the non-hatched part), notwithstanding the fact that the same voltages are applied to the electrodes 20a and 20b, respectively, and that the oxide layer has a uniform thickness, the potential $-\emptyset$ under the poly electrodes is lower than under the metal electrodes. This difference is due to the fact that the effective thickness of the dielectric under the poly electrodes is larger than under the Al electrodes owing to the presence of the depletion regions in the poly electrodes. As a result, potential barriers for electrons are formed under the Al electrodes 20a, 21a, which barriers prevent transport of electrons from the righthand to the lefthand side.

At t1, $\emptyset_1$ is at the high voltage level and $\emptyset_2$ is at the low (most negative) voltage level. Under the electrodes 20, a potential well is formed, into which charge (indicated by hatched lines) can flow; under the electrodes 21, a potential barrier is formed, which is higher under the electrode 21a than under the electrode 21b. At t2, $\emptyset_2$ is at the high voltage level and $\emptyset_1$ is at the low voltage level. The charge now flows into the potential well under 21b, as is indicated by the arrows. The high potential barrier under 20a prevents charge from flowing from the righthand to the lefthand side.

In this manner a 2-phase CCD is obtained without additional steps being taken in the semiconductor body or in the oxide layer 5 to obtain the potential profile required for 2-phase operation.

Figure 5:
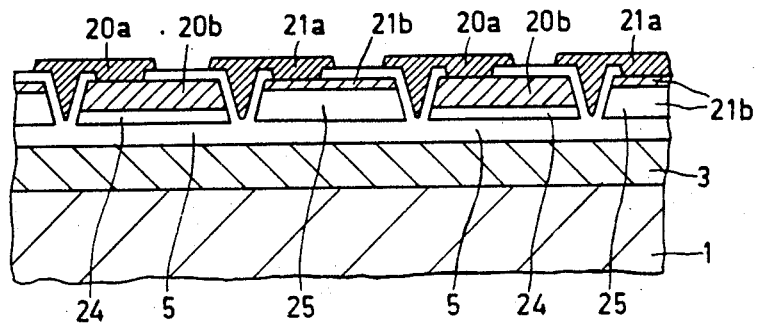
FIGS. 5–7 are sectional views of modifications of the charge-coupled device shown in FIG. 3.

FIG. 5 shows a sectional view of a similar 2-phase charge-coupled device which differs from the device shown in FIG. 3 in that the metal electrodes 20a,21a are directly connected through windows in the oxide layer covering the poly electrodes 20b,21b. Separate connections between the high-ohmic poly electrodes 20b,21b and the clock lines not shown in the drawing are therefore not necessary in this case.

Figure 6:
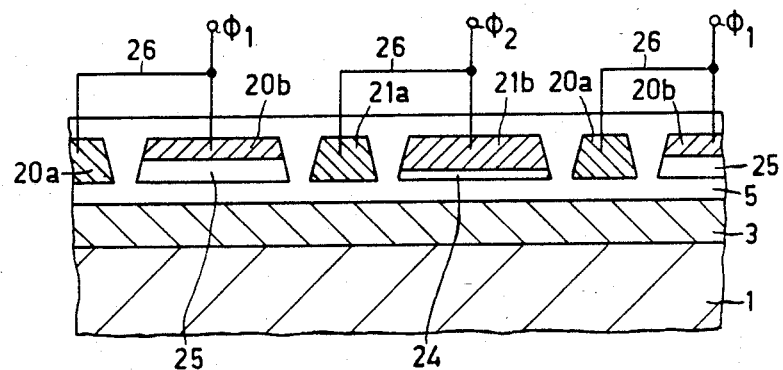

FIG. 6 is a sectional view of a second embodiment of the 2-phase device shown in FIG. 3. The charge storage electrodes 20b,21b are again manufactured from high-ohmic polycrystalline p-type silicon. The transport electrodes 20a,21a in this case are not made of metal, but of an n-type doped semiconductor material, more particularly n+-type polycrystalline silicon having a doping concentration between $10^{19}$ and $10^{21}$ atoms/cm$^3$, as is usual in semiconductor technology in the manufacture of polycrystalline wiring. During operation, there are formed in the p-type electrodes 20b,21b depletion regions 24,25, which, dependent upon the positive and negative sweep of the clock voltages, have a larger or smaller depth. Such depletion regions are not formed in the n-type electrodes 20a,21a, in which just due to the higher voltage of the layer 3 accumulation of electrons occurs at the interface between the electrodes 20a,21a and the oxide layer 5. The effective distance between the electrodes 20a,21a and the layer 3 is therefore determined completely by the thickness of the oxide layer 5. In the same manner as the potential barriers under the metal electrodes 20a,21a in the embodiment shown in FIG. 3, such potential barriers are now formed by the n-type electrodes 20a,21,a which potential barriers determine the direction of transport in the channel 3.

The n-type electrodes 20a,21a can be connected through a metal wiring 26 (for example of Al) to the associated storage electrodes 20b and 21b, respectively, as is indicated diagrammatically in FIG. 6.

Figure 7:
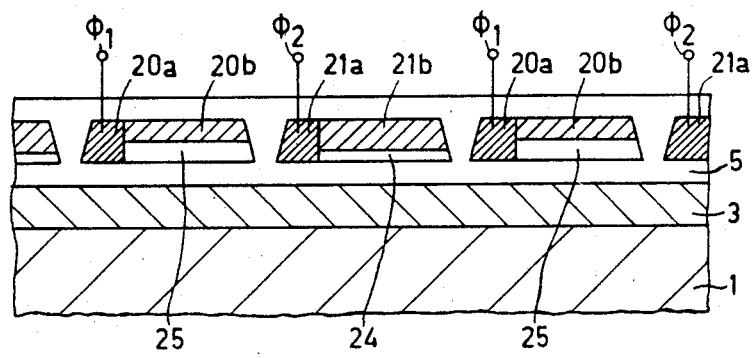

FIG. 7 is a sectional view of a second modification of the device according to FIG. 3. The electrodes 20a,b and 21a,b are now constituted by single coherent p-type poly strips. The parts 20b,21b again have the low doping concentration, as a result of which the depletion regions 24,25 can be produced in these parts. The parts 20a,21a are also p-type conducting, but have such a high doping concentration that no (or at least no effective) depletion layers are formed in these parts, as a result of which the effect of the parts 20a,21a is practically identical to that of the metal electrodes 20a,21a in the embodiment shown in FIG. 3.

It should be noted that the parts 20a–20b or 21a,21b, which in the embodment described here are manufactured from the same poly layer, may also be formed in two different poly layers connected to each other. Moreover, it should be noted that the depletion layers 25, which are shown in FIGS. 3, 5, 6, 7 only over part of the thickness of the electrodes, may also extend over the whole thickness of the electrodes with a suitable choice of the thickness of the polycrystalline material. This may offer advantages due to the formation of drift fields in subjacent parts of the channel and the charge transport connected therewith.

Figure 8:
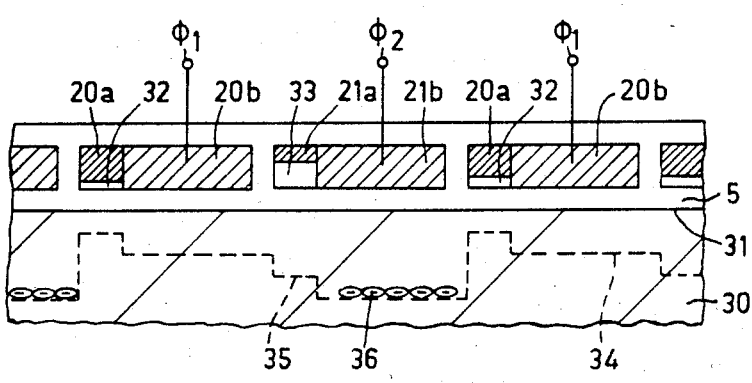
FIG. 8 is a sectional view of a 2-phase surface CCD according to the invention.

FIG. 8 shows an embodiment of a 2-phase surface CCD, in which use is made of depletion in the gate electrode. The device is also of the n-channel type and comprises a p-type substrate 30, which is frequently used for surface CCD's and whose surface 31 is provided with an oxide layer 5. On the oxide layer 5 are arranged the electrodes 20,21, which comprise the parts 20a,20b and 21a,21b, respectively. The parts of the electrodes provided with the suffix a again constitute the transfer or barrier parts of the electrodes; the parts provided with the suffix b constitute, as in the preceding embodiments, the charge storage parts. In contrast with the preceding embodiments, the transfer parts 20a,21a are weakly doped, in this case with a doping of the n-type. The storage parts 20b,21b are constituted by strongly doped n-type polysilicon.

With a doping concentration in the substrate of, for example, $10^{17}$ atoms/cm$^3$, a concentration of $5.10^{16}$ atoms/cm$^2$ may be chosen for the high-ohmic parts 20a,21a.

When a positively clocked potential difference is applied between the electrodes 20,21 on the one hand and the substrate 30 on the other hand, a depletion region is formed in the substrate 30, which region can be used as a charge storage medium for electrons. At the same time, a depletion region will be induced in the high-ohmic parts 20a,21a due to the negative bias voltage of the substrate 30 with respect to the electrodes 20,21. Due to the high doping, the formation of such depletion regions in the parts 20b,21b is prevented.

The depletion regions 32,33 are indicated in the electrodes 20a,21a by non-hatched parts. Due to the high doping concentration, such depletion regions are not formed or are formed to such a small extent in the electrodes 20b,21b that their effect is negligible. The depth of the depletion regions 32,33 depends upon the level of the clock voltages $\emptyset_1$, $\emptyset_2$. At the most positive voltage level of the clock voltages, the voltage difference between the substrate 30 and the electrodes will be maximum, as a result of which the depletion layer in the electrodes will then be of maximum thickness (32). At the lowest voltage level, the thickness of the depletion layer will on the contrary not be thinner (33).

As in the preceding embodiments, the depletion zones or layers 32,33 bring about an electrical decoupling between the electrodes and the substrate 30.

However, in contrast with the preceding embodiment, potential barriers are formed under the high-ohmic electrodes or electrode parts 20a,21a and potential troughs are formed under the low-ohmic parts 20b,21b. This is indicated diagrammatically in FIG. 8 by the curve 34 which represents the variation of the surface potential along the surface 31. The curve 34 is drawn at an instant at which $\emptyset_2$ is at the high ("positive") voltage level and $\emptyset_1$ is at the lowest ("negative") level. The electrons 36 in this situation are stored under the electrode 21b and at the surface 31. In the next period, the potential profile 34 is shifted by one place to the right. The electrons 36 are also transferred and are at the same time prevented by the barrier 35 under the electrode 21a from flowing to the left.

It should be appreciated that the modifications described with reference to FIGS. 3–7 for bulk CCD's may also be obtained for surface CCD's, in which event it should be noted that the depletion layers formed in the electrodes define in bulk CCD's the charge storage parts of the clock electrodes, but that they define in surface CCD's the charge transfer parts (barriers).

Figure 9:
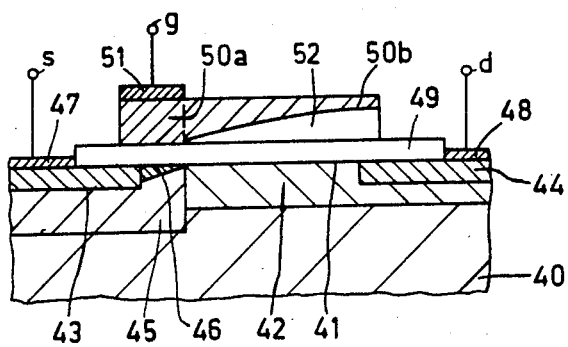
FIG. 9 is a sectional view of a D-MOST according to the invention.

Besides CCD's, the principle of the depleting gate electrode may also be applied advantageously to other types of field effect devices. An embodiment of a so-called double-diffused insulated gate field effect transistor or D-MOST provided with a depleting gate electrode will now be described with reference to FIG. 9. The embodiment relates to an n-channel D-MOST, but it should be appreciated that the invention may also be used for p-channel transistors. The device, which is shown in sectional view in FIG. 9, comprises a p-type semiconductor body or substrate 40, which is provided at the surface 41 with a high-ohmic drift region 42. In the present embodiment, the drift region is constituted by a weakly doped region, which may be either of the n- or of the p-type, but in the present embodiment is of the n-type. The transistor comprises an n-type source zone 43, a drain zone 44 likewise of the n-type and a p-type zone 45 which surrounds the source zone 43 and in which the channel 46 is defined. As is known, the source zone 43 and the p-type zone 45 can be formed through the same doping mask, as a result of which the channel region or at least the length of the channel region is completely determined by the difference in diffusion depths of the zones 43 and 45. The source and drain zones 43 and 44 are provided with source and drain contacts 47 and 48, respectively, which are indicated only diagrammatically. The surface 41 is coated with an insulating oxide layer 49, which constitutes the gate dielectric of the transistor. The gate electrode 50 is provided on the layer 49 in the fom of a layer of polycrystalline silicon.

The transistor may be manufactured by means of techniques known to those skilled in the art, in which the source zone 43, the drain zone 44 and the channel zone 45 may be provided in a self-registering manner with the gate electrode 50. That part 50a of the gate electrode which is located above the channel 46 may be rendered low-ohmic by means of one of the techniques known per se, for example, by a high doping. It is also possible to provide this part, which constitutes the gate electrode proper, which modulates the conductivity of the channel 46, with a metal contact 51. The part 50b has a comparatively high resistance, as will be explained more fully hereinafter.

In usual transistors of the type described here, in which the gate electrode is doped to the highest possible extent, the overlap between the gate electrode and the drift region 42 has great disadvantages. Calculations have shown that accumulation of charge may occur in the drift region at lower voltages $V_d$ and at higher currents, which may adversely affect the mutual conductance characteristic. Moreover, the Miller capacity between gate and drain often becomes undesirably large.

According to the invention a gate electrode 50 is used, which is weakly p (p$^-$) doped with an impurity concentration between, for example, $5.10^{15}$ and $10^{17}$ atoms/cm$^3$. When during operation a positive voltage is applied to the drain d, while the drift region 42 is depleted, a depletion zone 52 is also formed in the part 50b. This depletion zone, indicated in the drawing by the non-hatched part 52 of the electrode, whose thickness increases from the source to the drain, brings about an electrical decoupling between the drift region 42 and the gate electrode 50. Detrimental effects due to the overlap between the gate electrode 50 and the drift region 42 can thus be avoided at least for the major part.

The inversion layer 46 in the channel region consisting of a layer of electrons may cause charge accumulation of holes at the interface between the gate electrode 50a and the gate oxide 49, as a result of which the resistance in the part 50a of the gate electrode is reduced.

Figure 10:
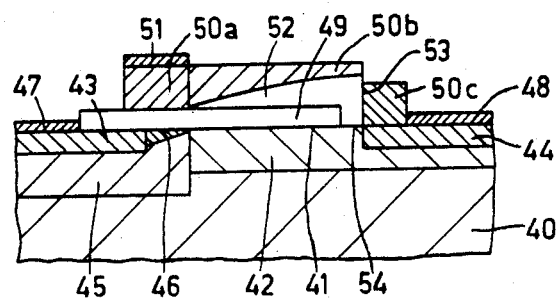
FIG. 10 is a sectional view of a modification of the transistor of FIG. 9.

Dependent upon the doping in the poly electrode 50b and the applied voltages, accumulation of thermally generated electrons may occur at the interface between the poly electrode 50b and the oxide layer 49. For high switching frequencies, the speed of generation of electrons is in general too low, so that in this case the possibility of such inversion layers being formed is small. At lower switching frequencies or with a given DC adjustment, however, such inversion layers may be obtained. FIG. 10 shows a manner in which this can be avoided. This Figure is again a sectional view of a D-MOST comparable with that in the preceding embodiment and in which corresponding parts are provided with the same reference numerals. In comparison with the preceding embodiment, the gate electrode 50 extends beyond the drain zone 44. When the drain 44 is provided, a part 50c of the p⁻ type gate 50 is n+ doped. As a result, a pn junction 53 is formed in the gate electrode, while between the drift region 42 and the gate electrode 50 a pn junction 54 is formed. During operation, the pn junction 53 is biased in the reverse direction when a higher voltage is applied to the drain zone 44 than to the gate 50. Electrons generated in the gate electrode 50 will then be drained by the cut-off pn junction 53 and therefore cannot form an inversion layer in the depletion layer 52.

It should be noted that, when a higher voltage is applied to the gate electrode 50 than to the drain zone 44, it is possible for the pn junction 53 to be biassed in the reverse direction and for current to flow between the gate connection 51 and the drain zone 44. Due to the high resistance of the gate electrode 50b, this current can be kept at an acceptably low level.

Figure 11:
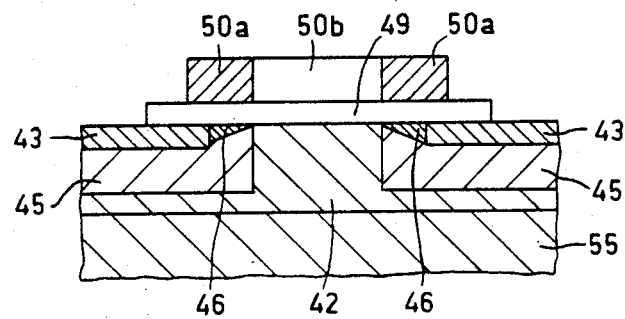
FIG. 11 is a sectional view of a vertical D-MOST according to the invention.

The MOS transistors described here are lateral transistors, source and drain zones both being located at the surface 41. FIG. 11 shows an embodiment of a vertical D-MOST according to the invention. The Figure shows a part with two source zones 43 surrounded by two channel regions 45 (or two parts of a common source zone with a closed configuration), which enclose the drift region. The drain zone is constituted by the n+ region 55, which, in the case of a discrete transistor, constitutes the substrate of the device. The current, after having arrived through the channels 46 at the drift region, flows in vertical direction to the substrate 55. The composition of the gate electrode 50 may be the same as in the embodiment shown in FIG. 9 with a non-depleted part 50a above the channel region 46 and a depleted part 50b above the drift region 42. The depletion layer in the part 50b has the same advantages as in the preceding embodiments, i.e. a decoupling between the gate and the drift region, as a result of which the ideal characteristics of the D-MOST can be approached more closely.

Figure 12:
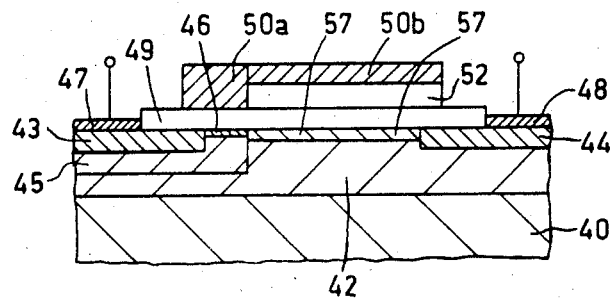
FIG. 12 is a sectional view of a further embodiment of a transistor according to the invention.
Figure 13:
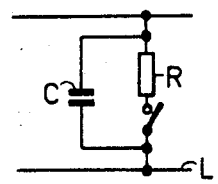
FIG. 13 shows the circuit diagram of the transistor of FIG. 12 used as a switch.

FIG. 12 is a sectional view of a D-MOST which can be used as a switch, for example, in tuning and/or preselection systems in digital circuits in R.F., F.M. or T.V. receiver applications. FIG. 13 shows the circuit diagram of such a switch, which constitutes a connection path between a high level H and low level L. The switch has a parasitic capacitance C and a parasitic resistance R. In order to keep the impedance between H and L at a minimum value in the "on" state of the switch ($Z_{on}$), R has to be as low as possible. In the "off" state of the switch, the impedance ($Z_{off}$) should be as high as possible. This means that C has to be as small as possible. It is known to use diodes for this purpose. However, in order to obtain a sufficiently low resistance, it is necessary to cause a comparatively large current to flow through the diode. A field effect transistor provides the possibility of keeping the dissipation low both in the "on" and in the "off" state. Within the group of field effect transistors, the D-MOST has the additional advantage of a comparatively low resistance due to the small channel length. However, the drift region of a D-MOST provides a comparatively large C due to the overlap between the drift region and the gate electrode. Moreover, the resistance is nevertheless often larger than is desirable. FIG. 12 shows a D-MOST configuration according to the invention, in which these disadvantages are obviated for the major part.

The transistor is again for the D-MOST type and comprises an n-type substrate 40. The high-ohmic region 42 is constituted, in contrast with the preceding embodiments, by a p⁻-type region having a doping concentration of about $5-10^-$atoms/cm³. The region 42 may be formed in known manner by epitaxy or by ion implantation. The channel region and the source and drain zones are again constituted by the p-type zone 45 and the n-type surface zones 43 and 44, respectively. In the drift region, an n-type surface zone 57 is formed having a thickness of about 0.5 μm and a doping concentration of about $5.10^{17}$ atoms/cm³. The gate electrode 50 again consists of p-type silicon, at least the part 50b again having such a low doping concentration (effectively less than $2.10^{15}$ atoms/cm³) that under normal operating conditions a depletion layer can be formed therein. This depletion layer is allowed to extend throughout the thickness of the electrode 50b.

In the "on" state, a positive voltage is applied to the gate electrode 50, as a result of which an n-type channel 46 is induced in the channel region 45, which channel forms a connection between the source zone 43 and the drain zone 44. The resistance of the zone 57 is so low that the overall resistance between source zone and drain zone is mainly determined by the resistance of the channel 46. Due to the small channel length, this value can be kept at a very low level.

In the "off" state, for example, a negative voltage (with respect to the potential of the source zone) is applied to the gate electrode. In the absence of a channel 46, no current can now flow between the source and the drain. Due to the voltage difference between the gate 50 and the drain zone 44, a depletion region 52 is formed in the gate electrode, which region is indicated in FIG. 12 again by the non-hatched part of 50b. The depletion region 52, which extends from the oxide layer 49 over at least part of the thickness of 50b, brings about a decoupling between the gate electrode and the drain zone 44, as a result of which the capacitance between the gate electrode and the drain zone and hence also the parasitic capacitance C across the switch becomes small. The contribution of this capacitance via the substrate 40 can be kept low with the aid of the depleting p⁻ region 42.

Figure 14A:
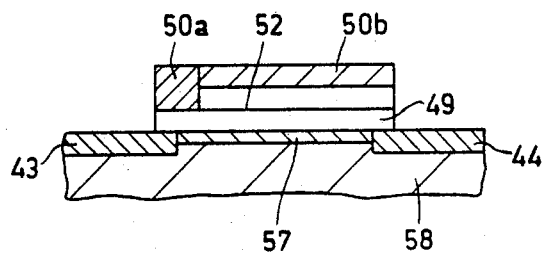
FIG. 14 shows two modifications of the transistor of FIG. 12.

The effect described here of reduced capacitance in the "off" state can be utilized not only with a D-MOST but also with other usual types of MOS transistors. FIG. 14a is a sectional view of such a switch comprising a usual MOS transistor of the so-called depletion type. The transistor comprises a p-type substrate 58 in which the n-type source and drain zones 43 and 44 are formed. On the gate oxide 49 is arranged the p-type poly electrode 50 comprising a low-ohmic part 50a and a high-ohmic part 50b, which is located above the part of the channel adjoining the drain zone 44. For example, by means of ion implantation, a thin, comparatively low-ohmic n-type zone 57 is formed in the channel region between the source and the drain zone. The transistor can be brought into the "off" state by applying a negative voltage to the gate electrode. Due to the voltage difference between the gate electrode and the drain zone 44, a decoupling depletion region 52 can be formed again in the gate electrode, as a result of which the gate/drain capacitance is considerably reduced. The n-type layer 57 again has the advantage that a low "on" resistance is obtained.

Figure 14B:
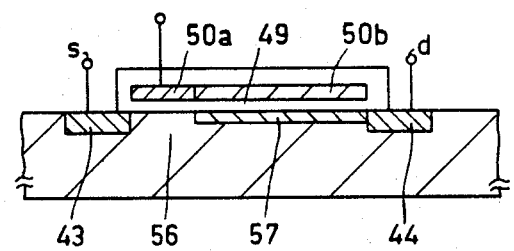

FIG. 14b shows a modification of the transistor of FIG. 14a, in which the n-type zone 57 is connected only to the drain zone 44 and extends from the drain zone over only part of the overall distance between the zones 43 and 44. Since the zone 57 can also be considered as a part of the drain, such a transistor is also designated as "extended drain MOST". The gate electrode again comprises a highly doped part 50a of p+ polycrystalline silicon, which is located above the non-redoped part 56 of the semiconductor body which constitutes the channel region proper. The gate part 50a passes into the part 50b which lies above the zone 57 and which is only weakly p-type doped. Its doping is chosen again to be so low that the formation of a depletion zone (not shown) herein is possible in order to reduce parasitic capacitances, as has been described above.

Figure 15:
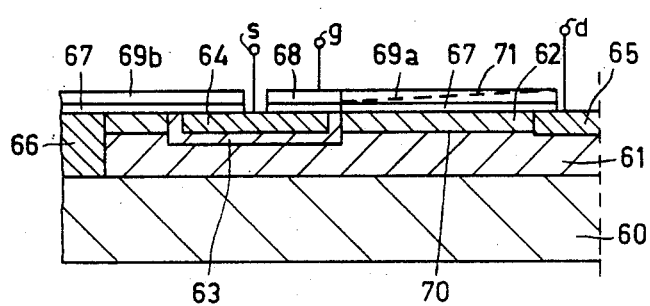
FIG. 15 is a sectional view of a high-voltage d-MOST according to the invention.

FIG. 15 shows an embodiment of a semiconductor device, in which the invention is used in a voltage-increasing field plate of a high-voltage element, which, by way of example, again is a D-MOST or a double-diffused transistor. Although the invention is not limited thereto, the embodiment is based on the so-called resurf principle, as has been described inter alia in the Dutch Application No. 8200464 mentioned above. The device can be ssumed to be rotationally-symmetrical about the dotted line, but other configurations are of course also possible for those skilled in the art.

The device shown in FIG. 15 comprises a substrate 60 of, for example, n-type silicon. The thickness of the sustrate 60 is not critical. The doping concentration is, for example, about $5.10^{14}$ atoms/cm$^3$. On the substrate 60 is formed a p-type epitaxial layer 61 having a doping of $2.10^{12}$ atoms/cm$^2$. At the surface of this layer there is formed, for example by ion implantation, an n-type surface layer 62 having a net doping of $2.10^{12}$ atoms/cm$^2$, which forms the drift region of the transistor.

Further, the p-type zone 63, in which the channel region of the transistor is defined, and the n-type source zone 64 as well as the n-type drain zone 65 are formed in the layer 61. The source and drain zones are provided with connections s and d, respectively, which are shown in the drawing only diagrammatically. If desired, the pn junction between the p-type zone 63 and the source zone 64 may be shortcircuited by the connection s, for example, by a local interruption in the source zone 64. The transistor is surrounded in the semiconductor body by a deep n-type zone 66, which extends from the surface of the semiconductor body to the substrate 60. The surface of the semiconductor body is coated with an insulating oxide layer 67, which constitutes the gate dielectric of the field effect transistor at least above the channel region. On the oxide layer 67 is formed the gate electrode 68 in the form of a high-ohmic polycrystalline silicon layer of the p-conductivity type. The gate connection g is shown only diagrammatically in the Figure. The doping of the p-type polycrystalline layer is about $10^{12}$ atoms/cm$^2$, which means a concentration of about $2.10^{16}$ atoms/cm$^3$ with a thickness of about 0.5 μm.

Besides the gate electrode 68 proper of the transistor, the polycrystalline layer also constitutes a voltage-increasing field plate 69 comprising a part 69a located above the drift region of the transistor between the p-channel zone 63 and the drain zone 65 and a part 69b located between the transistor and the deep n-zone n-zone 66.

As indicated in the aforementioned Dutch Patent Application, in a high-voltage transistor of the kind described herein based on the resurf principle, a high breakdown voltage can be obtained owing to the fact that the dopings and various dimensions are chosen so that the drift region 62 can be depleted throughout its thickness by applying a sufficiently low voltage to the field plate 69a and by applying a voltage in the reverse direction across the pn junction 70 between the p-type epitaxial layer 61 and the n-type surface region, which voltages are lower than the breakdown voltage. If the depletion of the drift region takes place only from the cut-off pn junction 70, the doping of the drift region can be at most about $10^{12}$ atoms/cm$^2$. This amount may be higher when depletion takes place not only from the pn junction 70, but also from the surface through an insulated field plate. The use of a field plate of a conventional composition, for example, of a metal or of highly doped polycrystalline silicon, however, may have a number of disadvantages, as already stated above, such as a reduction of breakdown voltage due to breakdown across the oxide or in the silicon in the case of overlap between the field plate 69a and the drain zone 65. These disadvantages are avoided for the major part by the use of a high-ohmic p-type field plate 69.

In the "on" state (when used as a switch), a positive voltage with respect to the source zone 64 is applied to the gate electrode or to the field plate 69. The transistor then again behaves like a normal transistor. No depletion region is formed in the gate electrode 68 or the field plate 69a. Accumulation of holes may occur at the interface between the field plate 69 and the oxide layer 67 due to field effect action.

Due to the higher permissible doping, the "on" resistance (R on) can be low and be of the order of about 1.0Ω/mm$^2$ for a 400 V transistor to 4.0Ω/mm$^2$ at a breakdown voltage of 800 V. In the cut-off state, such a low voltage is applied to the gate electrode 68 that no inversion occurs in the channel region of the p-type zone 63, while a large voltage difference can be allowed between the source and drain zones 54 and 65 of, for example, 400 V or even 800 V. The maximum voltage depends, as does the "on" resistance, upon inter alia the different dimensions and dopings. The high positive voltage at the source zone results in the pn junction 70 being biassed in the reverse direction and a depletion region is formed at this pn junction, which region extends from the pn junction over part of the thickness of the drift region 62. At the same time the (negative) voltage difference between the gate electrode/field plate 68,69a and the drain zone 65 causes a depletion layer to be formed, which extends from the oxide layer 67 downwards into the drift region. By means of the two depletion layers, the drift region can be depleted throughout its thickness according to the resurf principle at a voltage which is lower than the breakdown voltage. This depletion causes, as described in the aforementioned Dutch patent application, the surface field strength to be reduced so that breakdown occurs in the semiconductor body only at high voltages.

The high drain voltage causes not only depletion in the drift region 62, but also the formation of a depletion layer 71, which extends from the oxide layer 67 into the field plate 69a. The boundary of this depletion layer is indicated in FIG. 15 by a broken line.

The doping of the poly layer 69 is chosen so that at least in the vicinity of the drain zone 65, the depletion layer extends throughout the thickness of the poly layer at a voltage lower than the breakdown voltage. The voltage difference between the gate electrode/field plate 68,69a on the one hand and the drain zone 65 on the other hand is distributed over the oxide layer 67 and the depletion region 71. The electric field in the oxide layer 67 between the drain zone 65 and the field plate 69a is consequently considerably smaller than when the full voltage difference is applied across the thin oxide layer 67. In this manner, breakdown across the oxide and/or in the silicon 67 can be avoided, while due to the field plate 69a, double depletion of the subjacent drift region and hence a higher doping of the drift region is possible.

In an analogous manner, the drift region may also be depleted over the field plates 69b. These parts of the polycrystalline silicon layer may also be connected to to the gate electrode 68. However, in order to keep the gate/drain capacitance to a minimum value, the plate 69b may also be connected to a zone in the semiconductor body. for example, to the epitaxial layer 61 or to the substrate 60.

In the same manner as in FIG. 10, the p-type poly layer 69a may be connected through a rectifying pn junction to the n-type drain zone 65 in order to drain electrons from the poly layer and hence to prevent inversion in the poly layer.

Figure 16:
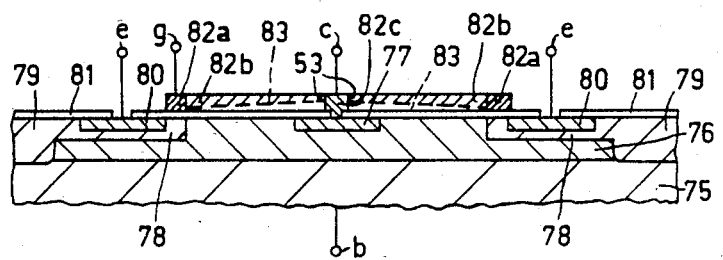
FIG. 16 is a sectional view of a high-voltage bipolar transistor according to the invention.

FIG. 16 shows the use of the depleting field plate in a bipolar transistor of the resurf type. By way of example, the device is of the npn type, but may of course also be of the pnp type, in which event all the conductivity types should be reversed. The transistor comprises a p-type region 75, for example, a substrate on which is disposed an n-type region 76, which is obtained, for example, by epitaxy. The region 76 itself constitutes the collector of the transistor and is connected through an n-type contact zone 77 to the collector contact C. The base comprises a p-type zone 78 which is formed in the n-type layer and may be connected through a deep p-type zone 79 to the region 75. The base contact is connected to this region and is represented diagrammatically by the connection b. The emitter 80 comprises an n-type surface zone provided with the emitter connection e. The surface of the semiconductor body is provided with an insulating oxide layer 81, which is provided with the required contact holes for the various contacts.

On the oxide layer 81 is disposed a field plate 82 which is mainly of the p-conductivity type. The part 82a has a high-ohmic p-type doping and is provided with a connection g. The field plate may be connected through this connection to the emitter 80 or to the base 78 or to another point having a substantially fixed potential of suitable value. The field plate proper is constituted by the high-ohmic part 82b of p-type polycrystalline silicon. The p-type part 82b passes via the pn junction 53 into an n-type sub-layer 82c, which is connected to the collector. Minority charge carriers present in the poly layer 82b can be drained via the cut-off pn junction 53 so that the formation of inversion layers in the poly layer 82b is prevented. The doping of the n-type region 76 is again about $2.10^{12}$ atoms/cm$^2$ (=product of concentration N/cm$^3$ and the thickness in cm). During the "on" state, the base/emitter junction is arranged in the forward direction and a current flows between the emitter and the collector. Due to the high doping, the "on" resistance may be comparatively low. In the "off" state, a high voltage difference may occur between emitter and collector. Owing to the resurf principle, according to which in the same manner as in the preceding example with respect to the drift region 62 of the D-MOST, the collector region 76 is depleted on the one hand by the cut-off pn junction between the regions 75 and 76 and on the other hand from the surface of the layer 76 by means of the field plate 82b, breakdown of the device is avoided. When moreover the field plate is given a low doping, for example, on the order of $10^{-12}$ boron atoms/cm$^2$, a depletion region 83 can be formed at the same time in the field plate, which region may extend throughout the thickness of the poly layer (at least locally) before breakdown occurs and which causes a decoupling between field plate and collector zone 77 and hence prevents breakdown.

Figure 17:
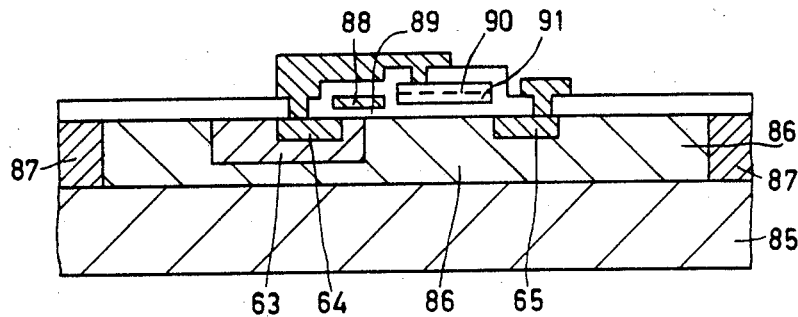
FIG. 17 shows a second embodiment of a high-voltage D-MOST according to the invention.

FIG. 17 is a sectional view of a D-MOST of the resurf type which is a modification of the transistor shown in FIG. 15. The n-type drift region 86 is constituted by an island-shaped part of an n-type epitaxial layer deposited on the p-type substrate 85, this island-shaped part being laterally limited by a p-type zone 87. The source zone, the drain zone and the channel zone are constituted in the same manner as in FIG. 15 by an n-type zone 64, the p-type zone 63 and the n-type zone 65, respectively. The composition of the zones 63-65 may be the same as in the embodiment of FIG. 15. Above the channel region of the transistor is disposed the gate electrode 88, which is separated from the channel region by the gate oxide 89. Above the drift region between the channel zone 63 and the drain zone 65 is disposed a field plate 90 which, as the field plate 69a in FIG. 15, serves to deplete the subjacent drift region 86. The thickness and the doping of the field plate are, for example 0.5 $\mu$m and $2.10^{16}$ atoms/cm$^3$, respectively. The overall doping, i.e. Nd, of the drift region 86 is about $2.10^{12}$ atoms/cm$^2$ owing to the possibilities of depleting the drift region 86 from two sides, i.e. from the pn junction between the drift region 86 and the substrate 85 and from the surface of the semiconductor body by means of the field plate 90.

Due to the low doping concentration in the field plate 90, simultaneously with the depletion of the drift region 86 a depletion zone 91 is also formed in the field plate, which extends at least locally throughout the thickness of the field plate before breakdown occurs. By this depletion zone and the reduction of the electric field across the subjacent oxide layer connected therewith, breakdown of the oxide and/or the silicon due to the voltage difference between the field plate and the drain is avoided.

In contrast with the embodiment shown in FIG. 15, the field plate 90 and the gate electrode 88 are separated from each other. This configuration yields an improvement in the frequency characteristics due to the fact that the gate/drain capacity, especially at lower voltages, has decreased. The field plate 90 itself is connected through the metal connection 92 to the source zone 64 and thus will generally have a fixed potential. Instead of being connected with the source zone 64, the field plate 90 may of course also be connected to other points of a fixed potential, for example to the zone 63.

Any desired doping can be provided in the gate electrode 88 because lateral diffusion, with which doping materials diffuse through the gate electrode 88 into the field plate 90, is excluded due to the gap between the field plate 90 and the gate electrode 88. The gate 88 may be doped, for example, simultaneously with the source/drain 64,65.

Figure 18:
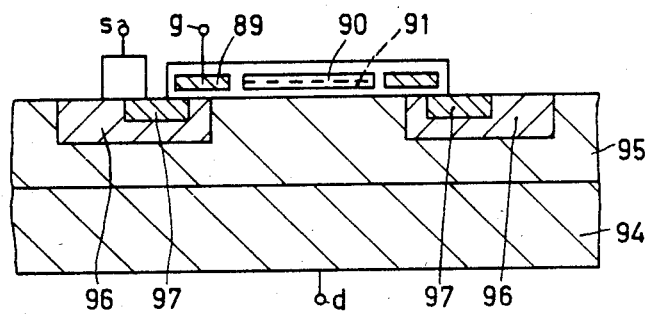
FIG. 18 shows a vertical high-voltage D-MOST according to the invention.

The decoupling described here between gate electrode and field plate may also be applied in other devices not belonging to the resurf type. FIG. 18 is a sectional view of a vertical high-voltage D-MOST having a gate electrode 89 and field plate 90 separated from each other. The drain zone is constituted by a strongly-doped n+ region provided with the drain electrode d shown only diagrammatically. On the region 94 is provided a high-ohmic n-type region 95 which constitutes the drift region. In the region 95, a p-type zone 96 with a closed configuration or several p-type fingers 96 can be provided, in which the channel region is defined. In the zone 96, the n-type source zone 97 is formed which is connected through the connection S to the zone 96. The p-type field plate 90 whose doping is so low that a depletion layer can be formed therein is decoupled from the gate electrodes 89 with the advantages described above and can be connected again to the source zone 97 outside the plane of the drawing. In the "off" state, a depletion layer can again be formed in the field plate 90 due to the high voltage at the drain, as a result of which the breakdown voltage between the field plate and the drain is increased.

Figure 19:
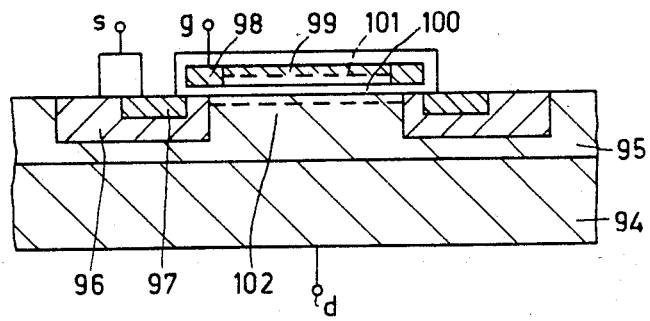
FIG. 19 shows a further embodiment of a vertical D-MOST according to the invention.

FIG. 19 is a sectional view of a vertical D-MOST, which can be considered as an alternative for the circuit arrangement shown in FIG. 12. The device is provided in the same manner as in the preceding embodiment with an n+ drain region 94, an n-type drift region 95, a p-type channel region 96 and an n+ source region 97. On the oxide layer 100 is provided a polysilicon layer comprising the part 98 above the channel zone of the transistor, which constitutes the gate electrode proper of the transistor and may comprise a strong n-type doping, and a high-ohmic part 99, whose doping is so low that a depletion layer can again be formed therein. In contrast with the preceding embodiments, the polysilicon layer 99 is of the n-type. In the "off" state of the transistor, the drift region under the electrode 99 is fully depleted. Due to the n-type doping, no depletion layer is formed in the electrode 99. However, when the drift region is chosen to be sufficiently thick and high-ohmic and the distance between the regions 96 is not excessively large, it is nevertheless possible to keep the parasitic gate/drain capacitances in the "off" state sufficiently low. In the "on" state, such a high voltage can be applied to the gate electrode 98 that the plate 99 has a higher potential than the drain d. In this situation, a depletion zone can be formed in the plate 99, which zone extends from the oxide 100 into the plane 99. The boundary of the depletion layer is indicated by the broken line 101. The positive space charge region in the poly electrode 99 produces a negative space charge region in the drift region consisting of an accumulation layer 102 of electrons. This layer produces a lower "on" resistance, while at the same time a low gate/drain capacitance is obtained due to the depletion layer 101 in the gate electrode.

It should be appreciated that the invention is not limited to the embodiments described herein, but that many variations are still possible for those skilled in the art without departing from the scope of the invention.

For example, in the embodiments described, the conductivity types may be reversed. Instead of silicon, also other suitable semiconductor materials may be used.

The high-ohmic material of the gate electrode may have a monocrystalline structure instead of a polycrystalline structure.

Instead of being provided with the ohmic connections indicated in the embodiments, the high-ohmic poly electrodes may often also be provided with other connections, for example, with capacitive couplings. Further, the invention may be advantageously used in other semiconductor devices than the types mentioned herein.

What is claimed is:

1. A semiconductor device comprising an element of the MIS type having a monocrystalline semiconductor body, one surface of which is provided with a comparatively thin dielectric layer which constitutes a gate dielectric of the MIS element and on which is formed a gate electrode of doped semiconductor material for influencing the surface potential in the semiconductor body, and means for electrically decoupling said gate electrode from said semiconductor body, said means comprising a high-resistivity part of said gate electrode adjoining said gate dielectric and having a sufficiently low doping concentration and a conductivity type such that, during operation of the device, while avoiding breakdown, a depletion layer can be formed which extends from the gate dielectric into the high-resistivity part of said gate electrode, wherein the device comprises a high-voltage element, at least the high-resistivity part of said gate electrode comprising a field plate, said field plate comprising adjacent regions of opposite conductivity types which form a rectifying junction for draining minority change carriers.

2. A semiconductor device as claimed in claim 1, wherein the semiconductor body comprises a substrate region of a first conductivity type and a semiconductor layer of a second, opposite, conductivity type which adjoins said substrate region and the surface of the semiconductor body, and which forms with the substrate region a pn junction, at least a zone of the high-voltage element being formed within the semiconductor layer, and the semiconductor layer can be depleted during operation at least locally over its whole thickness, and the substrate region over part of its thickness, at a reverse voltage across the pn junction which is lower than the breakdown voltage.

3. A semiconductor device as claimed in claim 2, wherein in that the doping concentration of the semiconductor layer is so high that at the breakdown voltage the first depletion layer associated with the pn junction extends over only part of the thickness of the semiconductor layer, and the gate electrode comprising the field plate is connected to a potential which, at least at a high voltage across the high-voltage element with respect to the semiconductor layer, has the same sign as that of the substrate region, as a result of which a second depletion zone extends below the field plate from the surface into the semiconductor layer.

4. A semiconductor device as claimed in claim 1, 2 or 3, wherein the high-voltage element is an insulated gate field effect transistor.

5. A semiconductor device as claimed in claim 4, wherein the field effect transistor is of the double diffused type, the gate electrode comprising a gate portion and a field plate portion, said gate portion being located above the channel region and said field plate portion being located above the drift region of the transistor, said gate portion and said field plate portion being electrically insulated from each other.

6. A semiconductor device as claimed in claim 5, wherein the field plate portion is electrically connected to the source zone of the field effect transistor.

7. A semiconductor device as claimed in claim 1, 2 or 3, wherein the thickness of the field plate is selected such that, in operation, a depletion layer can be formed at least locally throughout the thickness of the field plate.

8. A semiconductor device as claimed in claim 1, 2, or 3, wherein the high-resistivity part of the gate electrode comprises a layer of silicon, the doping concentration of which is at most about $10^{18}$ atoms/cm$^3$.

9. A semiconductor device as claimed in claim 8, wherein the doping concentration of the high-resistivity part lies between $10^{15}$ and $5.10^{17}$ atoms/cm$^3$.

* * * * *